US009917417B2

(12) United States Patent
Li et al.

(10) Patent No.: US 9,917,417 B2
(45) Date of Patent: Mar. 13, 2018

(54) METHOD AND SYSTEM FOR WIDELY TUNABLE LASER

(71) Applicant: Skorpios Technologies, Inc., Albuquerque, NM (US)

(72) Inventors: Guoliang Li, Albuquerque, NM (US); Stephen B. Krasulick, Albuquerque, NM (US); Damien Lambert, Los Altos, CA (US)

(73) Assignee: Skorpios Technologies, Inc., Albuquerque, NM (US)

( * ) Notice: Subject to any disclaimer, the term of this patent is extended or adjusted under 35 U.S.C. 154(b) by 0 days.

(21) Appl. No.: 15/285,042

(22) Filed: Oct. 4, 2016

(65) Prior Publication Data
US 2017/0110850 A1 Apr. 20, 2017

Related U.S. Application Data

(60) Provisional application No. 62/295,644, filed on Feb. 16, 2016, provisional application No. 62/241,549, filed on Oct. 14, 2015.

(51) Int. Cl.
*H01S 5/00* (2006.01)
*H01S 5/068* (2006.01)
(Continued)

(52) U.S. Cl.
CPC .............. *H01S 5/068* (2013.01); *H01S 5/021* (2013.01); *H01S 5/02284* (2013.01); *H01S 5/4012* (2013.01); *H01S 5/4087* (2013.01)

(58) Field of Classification Search
CPC ...... H01S 5/068; H01S 5/021; H01S 5/02284; H01S 5/4087; H01S 5/4012
See application file for complete search history.

(56) References Cited

U.S. PATENT DOCUMENTS 4,318,058 A * 3/1982 Mito .................... H01S 5/1028
372/50.11
6,501,782 B1 12/2002 Farmer
(Continued)

OTHER PUBLICATIONS

Berger, et al.; "Widely tunable external cavity diode laser using a MEMS electrostatic rotary actuator" Iolon, Inc.; San Jose, California; *IEEE*; 2001; TuA3.2.
(Continued)

*Primary Examiner* — Yuanda Zhang
(74) *Attorney, Agent, or Firm* — Kilpatrick Townsend & Stockton LLP

(57) ABSTRACT

A widely tunable laser system includes a substrate, first and second lasers, an output and at least one optical combining device. The first laser is integrated with the substrate, includes a gain medium that includes a first material, and emits light at a wavelength that is tunable within a first wavelength range that is determined at least in part by the first material. The second laser is integrated with the substrate, includes a gain medium that includes a second material, and emits light at a wavelength that is tunable within a second wavelength range that is different from the first wavelength range that is determined at least in part by the second material. The at least one optical combining device is configured to direct light from one or both of the first laser and the second laser to the output.

18 Claims, 12 Drawing Sheets

(51) Int. Cl.
  *H01S 5/02*  (2006.01)
  *H01S 5/022* (2006.01)
  *H01S 5/40*  (2006.01)

(56) References Cited

U.S. PATENT DOCUMENTS

| | | |
|---|---|---|
| 6,665,320 B1 | 12/2003 | Arbore et al. |
| 8,463,088 B1 | 6/2013 | Asghari et al. |
| 8,611,756 B1* | 12/2013 | Wach ........................ H01S 5/14 |
| | | 385/129 |
| 2003/0193974 A1 | 10/2003 | Frankel et al. |
| 2003/0214991 A1 | 11/2003 | Weidmann et al. |
| 2013/0156052 A1* | 6/2013 | Diehl .................... H01S 5/0612 |
| | | 372/20 |

OTHER PUBLICATIONS

Sasaki, et al.; "Wavelength selectable Microarray light sources"; Photonic and Wireless Devices Research Laboratories, NEC Corporation; Japan; *IEEE*; 2001; TuA3.3.

International Search Report and Written Opinion dated Dec. 20, 2016 for International Patent Application No. PCT/US2016/055329, filed Oct. 4, 2016; all pages.

* cited by examiner

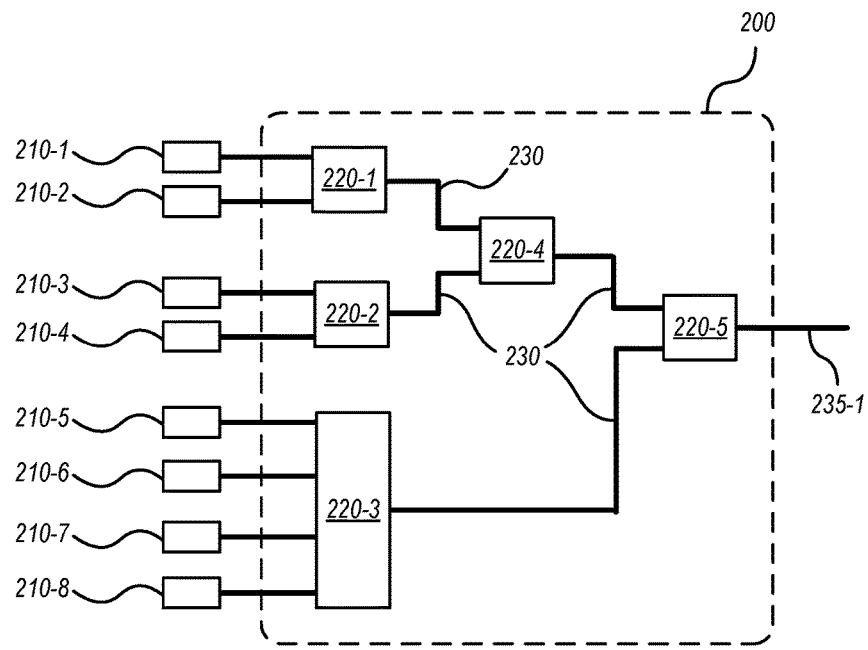
*FIG. 2*
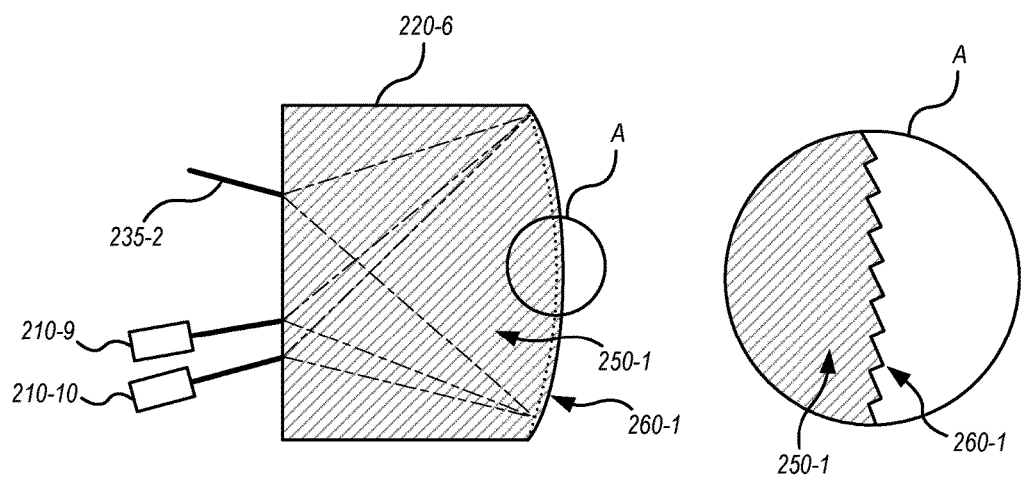
*FIG. 3A*          *FIG. 3B*

METHOD AND SYSTEM FOR WIDELY TUNABLE LASER

CROSS-REFERENCE TO RELATED APPLICATIONS

This application claims the benefit of priority to U.S. Provisional Patent Application No. 62/295,644, filed Feb. 16, 2016, entitled "Method and System for Widely Tunable Laser," and to U.S. Provisional Patent Application No. 62/241,549, filed Oct. 14, 2015, entitled "Method and System for Widely Tunable Laser," the disclosures of which are hereby incorporated by reference in their entireties for all purposes.

BACKGROUND

Lasers with tunable wavelength output are desirable for many applications. However, it is difficult to produce sources with wide tunability.

SUMMARY OF THE INVENTION

In an embodiment, a widely tunable laser system includes a substrate, first and second lasers, an output and an optical combining device. The first laser is integrated with the substrate, includes a gain medium that includes a first material, and emits light at a wavelength that is tunable within a first wavelength range that is determined at least in part by the first material. The second laser is integrated with the substrate, includes a gain medium that includes a second material, and emits light at a wavelength that is tunable within a second wavelength range that is different from the first wavelength range, and is determined at least in part by the second material. The optical combining device is configured to direct light from one or both of the first laser and the second laser to the output.

In an embodiment, a method for providing a widely tunable laser system includes arranging a one or more optical combining devices to form a combining arrangement having multiple inputs and a single output for the widely tunable laser system. The method also includes integrating a plurality of independently fabricated gain medium chips with a substrate and integrating each independently fabricated gain medium chip with a respective optical arrangement to form a corresponding plurality of individually tunable lasers. Each of the individually tunable lasers is tunable over an individual wavelength range, and is optically coupled with one of the multiple inputs. The method also includes switching the one or more optical combining devices so as to direct light from one or more selected ones of the plurality of individually tunable lasers through the combining arrangement into the single output.

BRIEF DESCRIPTION OF THE DRAWINGS

The present disclosure may be understood by reference to the following detailed description taken in conjunction with the drawings briefly described below. It is noted that, for purposes of illustrative clarity, certain elements in the drawings may not be drawn to scale. Specific instances of an item may be referred to by use of a reference numeral followed by a dash and a second numeral (e.g., MZI 100-1, 100-2) while reference numerals without dashes refer to one or more of any such item (e.g., MZIs 100).

FIG. 2 schematically illustrates a switching arrangement that, in embodiments, transfers output of one or more input laser sources to an output optical line, according to an embodiment.

FIG. 3A schematically illustrates an optical combining device based on an echelle grating surface, according to an embodiment.

FIG. 3B is an enlarged, schematic detail of a region denoted in FIG. 3A.

DETAILED DESCRIPTION OF SPECIFIC EMBODIMENTS

Figure 1A:
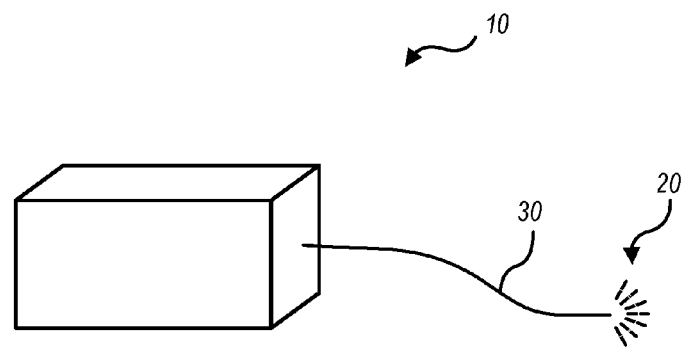
FIG. 1A schematically illustrates a widely tunable laser transmitting tunable laser light through a fiber optic, according to an embodiment.

Widely tunable laser sources have many potential applications in optical metrology, communications and other fields. However, it is difficult to produce sources with wide tunability. Some solid state lasers that generate light at a given wavelength typically rely on quantum phenomena that only produce light over a small wavelength range (e.g., a wavelength range that corresponds to a range of bandgap voltage of a semiconductor). Such effects typically limit wavelength tunability to a range of about 30 or 40 nm. Other lasers based on free space optics can be tuned over wider ranges. Being based on discrete, precision components, such lasers are relatively large and expensive, and their wavelength tuning is based on mechanical adjustment that, even when automated, is relatively slow and incurs relatively high optical losses and high external power consumption for optical power delivered.

Disclosed herein are embodiments that are based on providing a plurality of tunable input laser sources, and efficiently switching a selected one of the sources to an output, and/or arranging for the multiple sources to be coupled to the output. In certain of these embodiments, undesired ones of the sources are turned off or attenuated. In certain embodiments, multiple tunable sources of differing nominal wavelengths are multiplexed into a single output, for example by using one or more echelle gratings. In these embodiments undesired ones of the sources are turned off. These embodiments typically leave only one source turned on, but more than one source can remain turned on to provide a multiple wavelength output, with each nominal wavelength of the output being tunable. In other embodiments, switching is performed by ring oscillators arranged in stages. Each ring oscillator is provided with multiple wavelength inputs and tuned to switch one of the wavelengths into an output, and the stages are arranged in cascading relationship to select a single source as output from any number of tunable input sources. In some embodiments, a ring oscillator is used as a switch, having one input and two outputs.

In still other embodiments, switching is performed by Mach-Zehnder interferometers (MZIs), each of which switches one of two such sources to its respective output; each MZI can be regarded as a module or building block that can be combined with others. The MZIs can be cascaded to switch among any number of input sources. In embodiments, each MZI is based on multimode interference couplers (MMIs) that take two sources as inputs, and provide phase adjusters that force the MZI to direct only one of the sources to an output of the MZI. The phase adjusters can be implemented in a variety of ways, and in embodiments are implemented with relatively low power and high speed for efficient switching. The MMIs and phase adjusters can be implemented in a variety of ways, and can advantageously be fabricated utilizing wafer fabrication technology such as thin film deposition, photolithography, etching and the like that is derived from and compatible with semiconductor wafer fabrication. Embodiments herein can therefore be implemented on semiconductor wafers and directly integrated with semiconductor lasers as the input sources, optical receivers, control logic and the like, and may be packaged in standard electro-optical type packages. MZIs are particularly advantageous choices for switching among sources that are relatively near to one another in wavelength, and may thus advantageously be used as initial stages in a cascade switching arrangement.

Techniques for integrating waveguides, MMIs, MZIs, and direct bandgap semiconductor chips with silicon substrates, and wavelength tuning of lasers formed thereby, can be found in the following documents, which are incorporated herein in their entireties for all purposes: U.S. Pat. Nos. 8,615,025, 8,859,394 and 9,316,785; and U.S. Published Patent Application No. 2015-00311672A1; all of which are referred to collectively herein as "the incorporated applications."

Figure 1B:
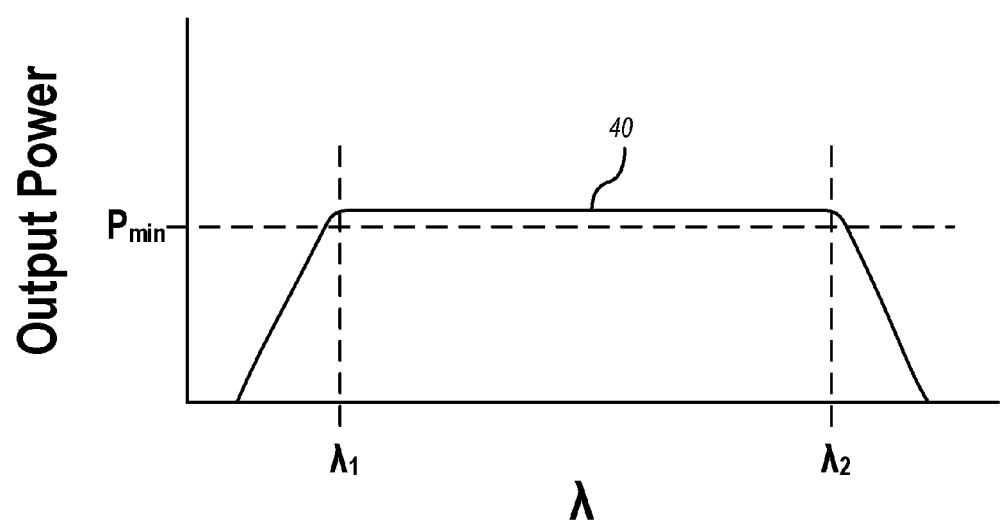
FIG. 1B schematically illustrates a tunability range of the tunable laser of FIG. 1A.

FIG. 1A schematically illustrates a widely tunable laser 10 transmitting tunable laser light 20 through a fiber optic 30. Fiber optic 30 is but one mode of providing tunable laser light 20 from laser 10; other embodiments may for example emit laser light 20 as a focused or unfocused beam into free space. FIG. 1B schematically illustrates a tunability range 40 of tunable laser 10. Laser 10 maintains a useful power $P_{min}$ over a wavelength range $\lambda_1$ to $\lambda_2$ where $\lambda_2$-$\lambda_1$ is at least 50 nm, and in embodiments can be much greater. Although FIG. 1B shows the output power over tunability range 40 as roughly constant between $\lambda_1$ and $\lambda_2$, this is not required; tuning and wavelength selection efficiencies such as discussed herein may impact output power of laser 10, but output power over the wavelength range $\lambda_1$ to $\lambda_2$ will always be at least some defined $P_{min}$.

FIG. 2 schematically illustrates an optical combining arrangement 200 that transfers output of one or more input laser sources 210-1 through 210-8 to an output optical line 235-1. Each of input laser sources 210-1 through 210-8 is tunable, and advantageously spectral ranges of tunability of the sources are contiguous such that light of one (or more) particular source(s) can be selected by arrangement 200 as a form of coarse wavelength tuning, and the selected source(s) can be further tuned to provide the output wavelength of interest. For example, each of input laser sources 210-1 through 210-8 may have a 30 nm tunability range, such that an overall tunability range achievable with switching arrangement 200 is 240 nm. In certain embodiments, input sources 210 that are selected according to the principles herein generate laser radiation using direct bandgap semiconductor chips (e.g., III-V materials such as GaAs, InGaAs, InAlGaAs, GaN, InP and others). In other embodiments, one or more external laser sources 210 are optically coupled into switching arrangement 200, e.g., using waveguides and/or fiber optic connections. In still other embodiments, some of the input sources are direct bandgap semiconductor chips such as discussed above, while others of the input sources are optically connected, external laser sources. Input sources 210 are selected and/or combined using optical combining devices 220, for example, exemplary optical combining devices 220-1 through 220-5 as illustrated in FIG. 2. Optical combining devices 220 combine and/or select one or more of input sources 210 onto intermediate paths 230 and eventually into a single output optical line 235-1, as shown. Thus, output available from output optical line 235-1 is operable as a widely tunable laser that can provide any wavelength within the overall ranges of input sources 210-1 through 210-8, by combining output from all such input sources together and tuning at least the one input source capable of producing the desired wavelength, to that wavelength. In certain embodiments, those input sources 210 that are not selected can be turned off or attenuated so that only a single wavelength is provided within output optical line 235-1, while in other embodiments multiple input sources 210 are both combined and left on, so as to provide multiple tunable wavelengths within output optical line 235-1.

Advantageously, at least some of input sources 210, optical combining devices 220, intermediate paths 230, and/or output optical line 235-1 in a switching arrangement 200 are integrated with other components on one or more silicon substrates to produce a widely tunable laser source (e.g., widely tunable laser 10). Such components may include (but are not limited to) gain chips, mirrors such as faceted surfaces and/or distributed Bragg reflectors, and the like to form laser sources 210, waveguides and/or fiber optics as intermediate paths 230, tuning elements, and others. The number, connectivity and arrangement of optical combining devices 220 in FIG. 2 is exemplary only; optical combining devices herein may couple two or more input sources to any of intermediate paths 230 and/or output optical line 235-1. Output optical line 235-1 may extend into an external fiber optic line (e.g., fiber optic 30, FIG. 1) or into a fiber optic connector, or may transfer output from switching arrangement 200 into free space, with or without optics to collimate or otherwise form the output into a desired beam shape.

FIG. 3A schematically illustrates an optical combining device 220-6 that utilizes an echelle grating surface 260-1. Optical combining device 220-6 takes two input sources 210-9, 210-10 as input and combines light in either or both of sources 210-9 and 210-10 into a single output line 235-2, which may be an instance of an intermediate path in an optical switching arrangement (e.g., any of intermediate paths 230 in optical switching arrangement 200, FIG. 2) or an output line (e.g., output line 235-1, FIG. 2). Similarly, input sources 210-9, 210-10 may be light generating devices, optical connections with external light generating devices or intermediate paths from upstream optical combining devices. Optical combining device 220-6 may be formed, for example, of a layer of a material 250-1 that is optically clear across the wavelengths of interest, bounded on one surface by grating surface 260-1. In FIG. 3A and other schematic illustrations herein, a grating surface is represented as a dotted line next to a boundary; FIG. 3B is an enlarged, schematic detail of a region denoted as A in FIG. 3A, showing blazed rulings of grating surface 260-1. Grating surface 260-1 may be formed, for example, by photolithography and etching, that is masking material 250-1 where it is to remain and etching exposed portions thereof, optionally followed by metallization of the etched surface to enhance reflectivity. The angles of incident input sources 210 and output line 235-2, and of grating surface 260-1 are illustrative only; actual angles will be implemented based on material used for material 250, wavelengths of interest and other factors, such as those discussed below.

An echelle grating can receive an input beam of mixed-wavelength light at a particular incidence angle, and diffract the light through angles that are wavelength-dependent. In this sense an echelle grating is like an imaging device, that is, it maps light received at one spatial input location, to specific spatial output locations based on a property of the light (e.g., wavelength). When the input angle is fixed, redirection of light to specific output angles will be a strong function of the light's wavelength. An echelle grating can also be utilized in the reverse direction, that is, it can receive light of particular wavelengths or wavelength ranges at certain spatial locations, and map the light thus received to a single spatial location. In the reverse direction, light received at a particular angle that is correct for a given wavelength will be transmitted most efficiently across that angle at the given wavelength, but when wavelength of the light is near but not exactly at the given wavelength, it will also be transmitted at that angle, with somewhat lower efficiency. The effect of efficiency variation with respect to wavelength can be mitigated somewhat by providing a spatially broad collection point such that light can be captured across a spread of angles that are close to the theoretical angle. However, small separations in nominal wavelength would correspond to small adjacent spacing of the input sources. Thus, the dependence of scattering angle on wavelength in an echelle grating does make its use more efficient when sources to be combined are separated in nominal wavelength to some degree, to reduce the challenges of managing such fine spacings between inputs.

Figure 4:
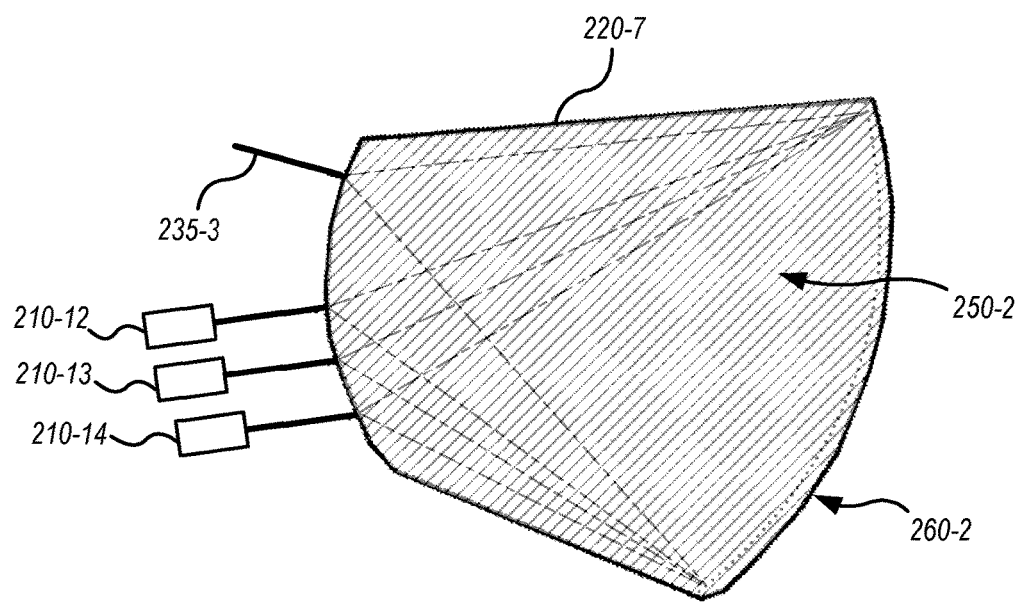
FIG. 4 schematically illustrates an optical combining device based on an echelle grating surface, according to an embodiment.

FIG. 4 schematically illustrates an optical combining device 220-7 that utilizes an echelle grating surface 260. Similar to optical combining device 220-6 (FIG. 3A), optical combining device 220-7 takes three input sources 210-12, 210-13 and 210-14 as input, and combines light from any of these sources into a single output line 235-3, which may be an instance of an intermediate path in an optical switching arrangement (e.g., any of intermediate paths 230 in optical switching arrangement 200, FIG. 2) or an output line (e.g., output line 235-1, FIG. 2). As per the above discussion about spacing of the input sources vs. reflection efficiency, optical combining device 220-7 can form a particularly advantageous widely tunable laser 10 when fine spacing of input channels can be achieved and when the tunability ranges of input sources 210-12, 210-13 and 210-14 overlap so as to produce a contiguous overall range.

Figure 5A:
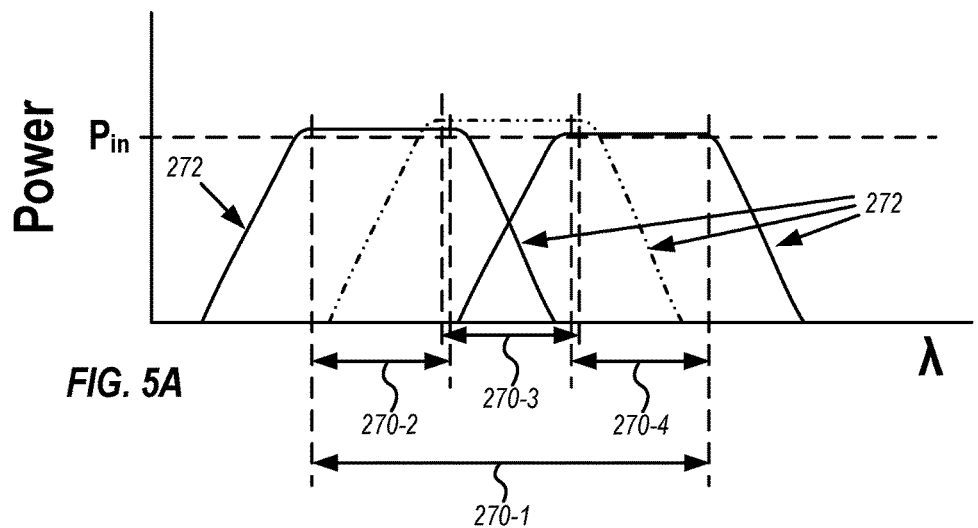
FIG. 5A shows an example of an overall range formed of individual, slightly overlapping ranges that are the individual tuning ranges of respective input sources, according to an embodiment.

FIG. 5A shows an example of an overall range 270-1 formed of individual, slightly overlapping ranges 270-2, 270-3 and 270-4, which are the individual tuning ranges of input sources 210-12, 210-13 and 210-14 respectively. (The individual tuning range of input source 210-13 is shown with a different line format than the other individual tuning ranges only for illustrative clarity.) Like FIG. 1B, FIG. 5A represents the power response of input sources 210-12, 210-13 and 210-14 as relatively constant across wavelength, but this is not required, and will usually not be the case. Also, FIG. 5A represents power spectra as delivered from sources 210-12, 210-13 and 210-14, and does not represent losses associated with combining the sources, as discussed below. The power delivered from each source is illustrated as having a level that is roughly flat across the identified range, but slightly different for each range, and in each case the flat portion is above a minimum input power $P_{in}$. Each of the power spectra "rolls off" at wavelengths above the noted limits of ranges 270-2, 270-3 and 270-4; the "roll off" portion of each of the power spectra is indicated at 272 (labeled at upper wavelength ends of each spectrum only, for illustrative clarity). Roll off portions 272 are illustrated as similar for each of sources 210-12, 210-13 and 210-14 but this is not required, and will usually not be the case. If each of ranges 270-2, 270-3 and 270-4 are about 35 nm wide and adjacent ranges are combined with about 5 nm overlap, range 270-1 will be about 95 nm wide.

Figure 5B:
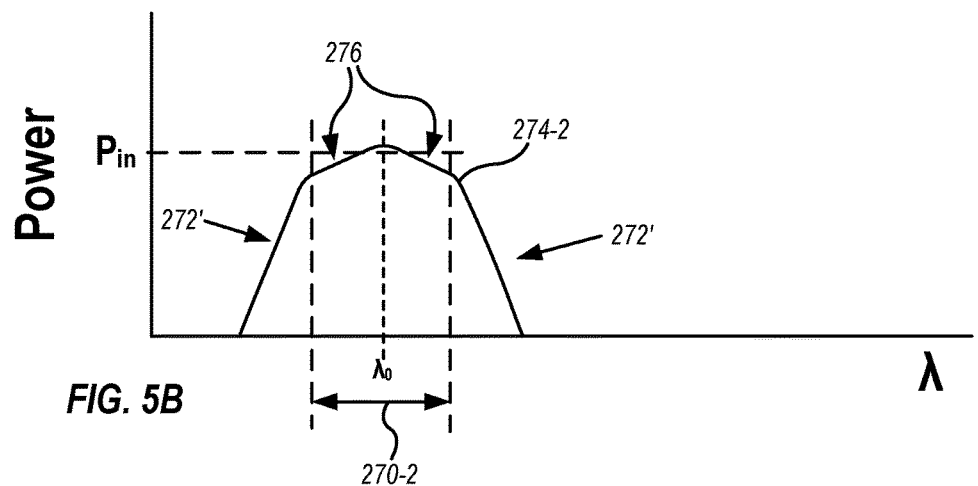
FIG. 5B shows an example of a power spectrum that is produced by passing light from one input source through an echelle grating, according to an embodiment.

FIG. 5B shows an example of a power spectrum 274-2 that is produced by passing the light from just one input source, for example input source 210-12, through an echelle grating. Because the echelle grating most strongly diffracts input light at a particular wavelength through a particular angle, and the input and output angles are fixed (e.g., as shown in FIG. 4) the output power passed through the echelle grating rolls off at wavelengths higher and lower than $\lambda_0$. Thus, power spectrum 274-2 forms rolloff regions 276 related to the response of the echelle grating, and rolloff regions 272' related to both the response of the echelle grating and the rolloff of the input source (e.g., as shown in FIG. 5A).

Figure 5C:
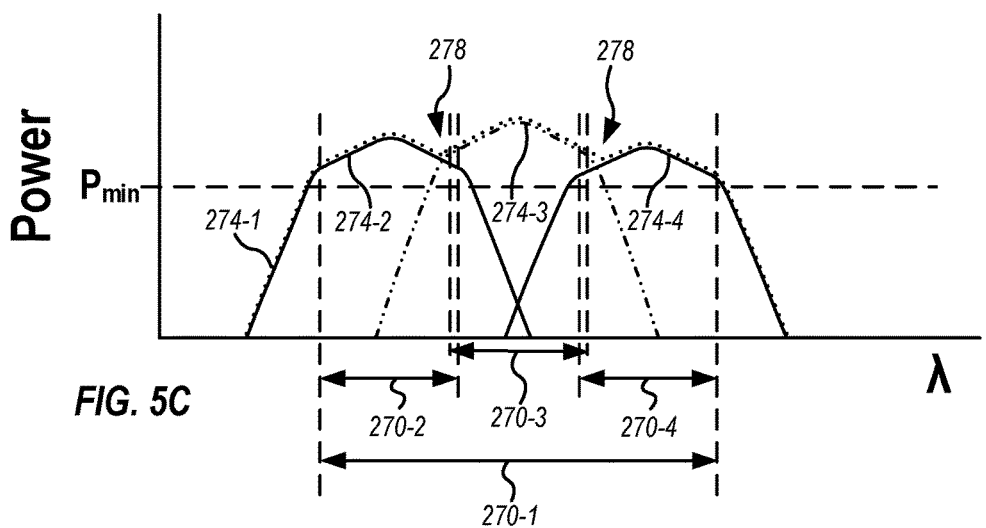
FIG. 5C shows an example of a power spectrum that is produced by passing the light from three input sources through an echelle grating, according to an embodiment.

FIG. 5C shows an example of a power spectrum 274-1 (dotted line) that is produced by passing the light from all of input sources 210-12, 210-13 and 210-14 through an echelle grating. The combined effects of the echelle gratings about their respective $\lambda_0$ wavelengths, and the roll off of each source, produces power spectra 274-2, 274-3 and 274-4. Power spectrum 274-1 tracks the highest value of power spectra 274-2, 274-3 and 274-4 at any given wavelength; because only one source will typically be selected and the others turned off, the power spectra will not add where they overlap. Because of the roll off effect of the echelle grating on power from each source that is actually transmitted through the echelle grating, gaps or dips 278 in output power spectrum 274-1 form at wavelengths that are intermediate to the $\lambda_0$ wavelengths. However, even at wavelengths where dips 278 occur, the sources can at least be arranged to maintain overall output power over some $P_{min}$ value, as shown.

Figure 6:
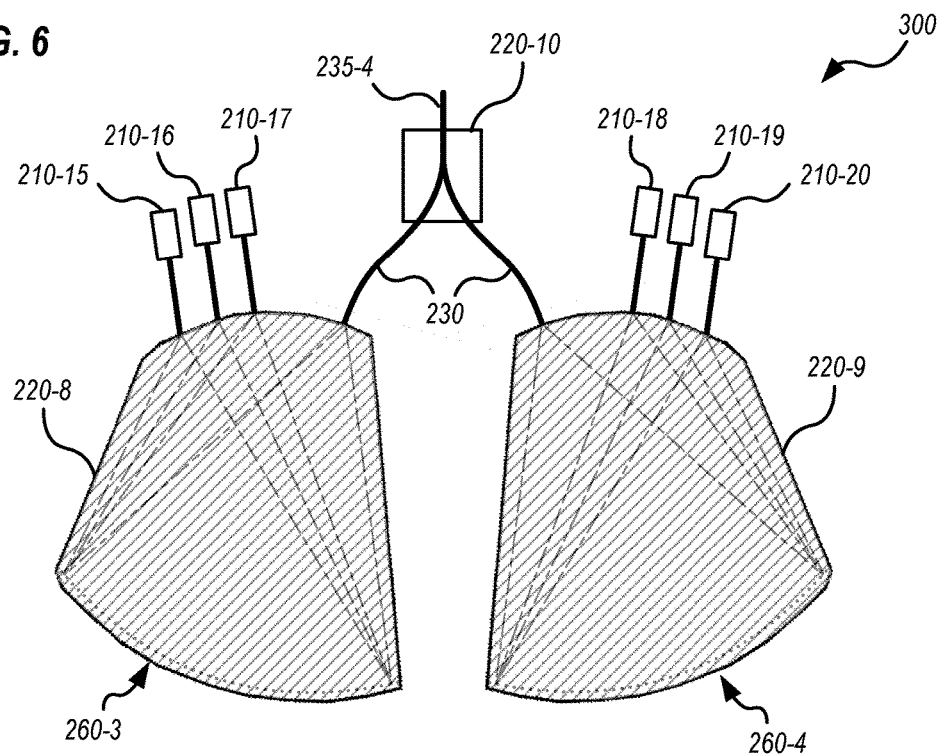
FIG. 6 schematically illustrates optical combining devices that utilize respective echelle grating surfaces, and a further optical combining device that is a Y-branch combiner, according to an embodiment.
Figure 7:
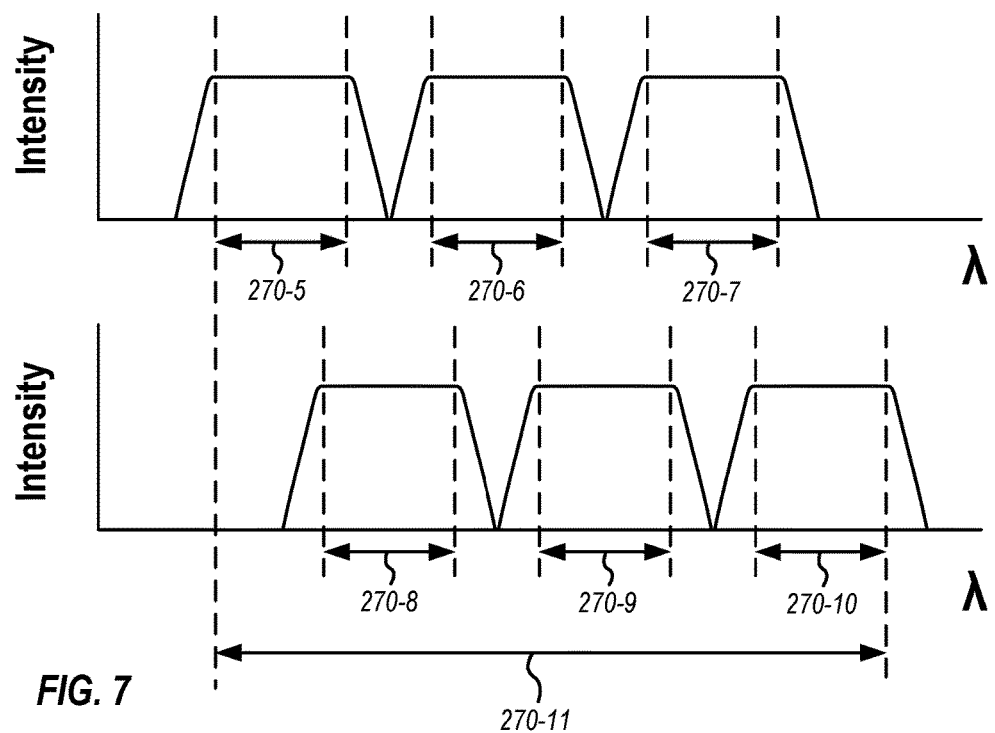
FIG. 7 shows an example of an overall range formed of individual tuning ranges of input sources shown in FIG. 6, according to an embodiment.

FIG. 6 schematically illustrates optical combining devices 220-8, 220-9 that utilize respective echelle grating surfaces 260-3 and 260-4, and a further optical combining device 220-10 that is a Y-branch combiner. These devices, taken together, combine light from six input light sources 210-15 through 210-20 first into intermediate paths 230, then into a single output line 235-4. Arrangement 300 can be particularly advantageous when ranges of sets of input sources to each of combining devices 220-8, 220-9 are arranged not to overlap, but such that one such set of sources "covers" the wavelength gaps in the other. That is, ones of the input sources having adjacent wavelength ranges are alternately assigned among combining devices 220-8 and 220-9. FIG. 7 shows an example of an overall range 270-11 formed of individual ranges 270-5 through 270-10, which are the individual tuning ranges of input sources 210-15 through 210-20 respectively. For example, ranges 270-5, 270-6 and 270-7 are the ranges of light sources 210-15, 210-16 and 210-17 respectively, and ranges 270-8, 270-9 and 270-10 are the ranges of light sources 210-18, 210-19 and 210-20 respectively. Ranges 270-5 and 270-6 are separated by a gap, but range 270-8 extends through all wavelengths in this gap. Ranges 270-8 and 270-9 are separated by a gap, but range 270-6 extends through all wavelengths in this gap, and so on. Thus, all wavelengths from the lower end of range 270-5 to the upper end of range 270-10 will be present in an overall range of wavelengths available at output line 235-4.

Because the redirection of light by an echelle grating is wavelength dependent, the presence of gaps between input wavelength ranges allows for larger physical spacing between adjacent input sources that are introduced to an echelle grating. That is, the greater the difference in the center wavelengths of the ranges of adjacent sources that are to be output at a given location, the greater the physical distance between the location of the sources. This provides a degree of relief from the need to manage very tight input channel spacings in design and manufacture of combining devices 220-8 and 220-9, in that adjacent sources combined in an echelle grating need not be introduced physically as close to one another as they would be if their wavelength ranges were closer together.

The outputs of each of combining devices 220-8 and 220-9 form intermediate paths 230 that are combined in Y-branch combiner 220-10. It is understood that a Y-branch combiner may introduce some net attenuation of the output of the system, which can be seen as a design tradeoff against the implementation of combining devices 220-8 and 220-9 with non-overlapping ranges. That is, the benefits of looser physical spacings between adjacent inputs into combining devices 220-8 and 220-9 may be somewhat offset by the attenuation due to the Y-branch combiner.

Figure 8:
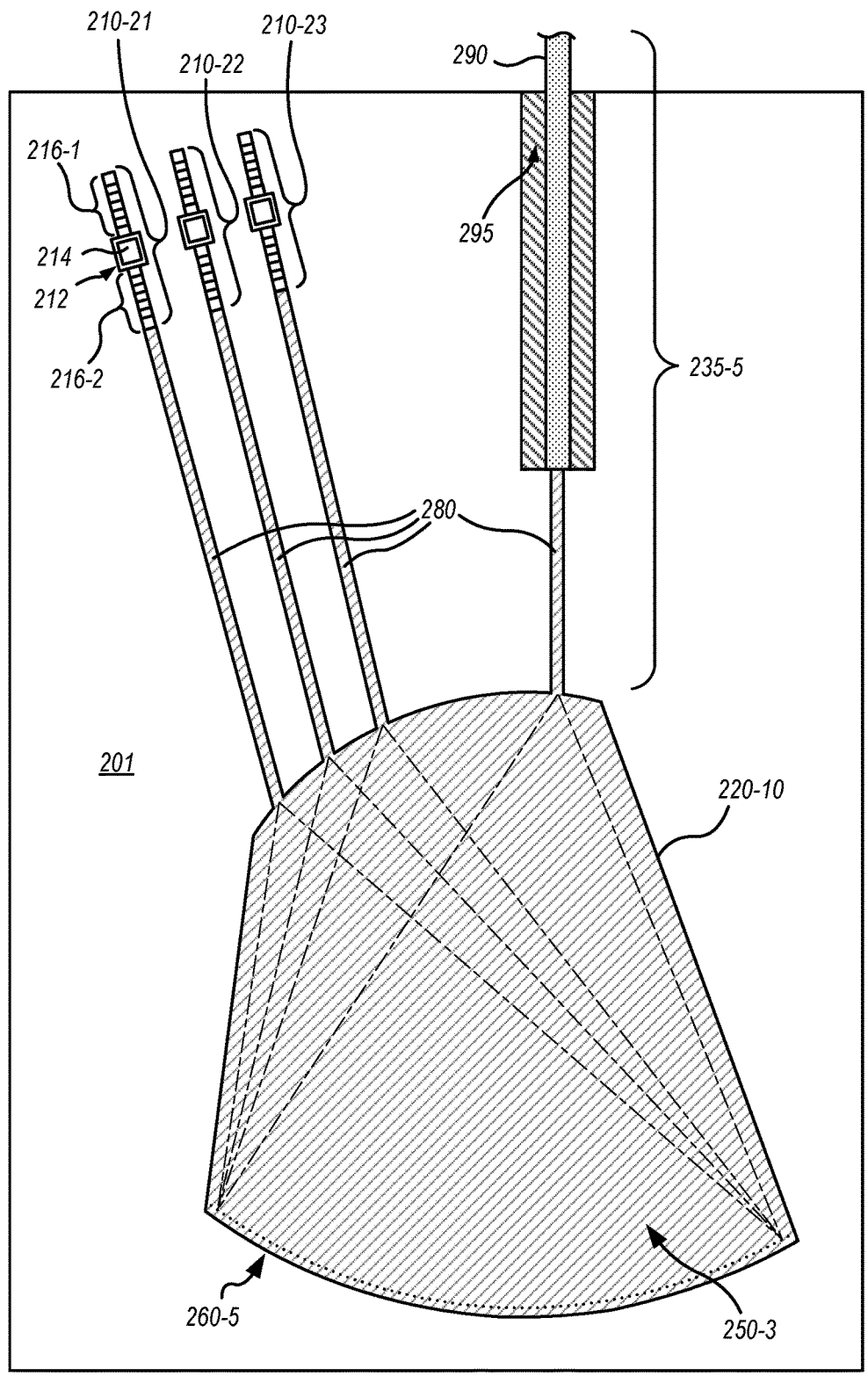
FIG. 8 schematically illustrates physical integration of a combining device based on an echelle grating surface, with input sources and an output fiber, all of which are coupled with a substrate, according to an embodiment.

FIG. 8 schematically illustrates physical integration of a combining device 220-10 based on an echelle grating surface 260-5, with input sources 210-21, 210-22 and 210-23, and an output fiber 290, all of which are coupled with a substrate 201. Substrate 201 may be for example a portion of a silicon substrate, or a silicon-on insulator substrate. Each of input sources 210-21, 210-22 and 210-23 may be formed by placing a gain chip 214 within a recess 212, and optically coupling distributed Bragg reflectors (DBRs) 216 to opposing sides of the gain chip 214 to form an optical cavity, to generate lasers as the input sources. Note, each of input sources 210-21, 210-22 and 210-23 include the same type and relative arrangement of gain chip 214 and DBRs 216, but these components are only labeled in input source 210-21 for clarity of illustration. In other embodiments, one or more end faces of gain chip 214 may be cleaved and/or metalized to provide reflectivity for the purpose of generating the optical cavity. Light from each input source 210 optically couples to a waveguide 280 that couples with combining device 220-10 at a predetermined location (that is based on the wavelength of each input source, as discussed above). The light scatters from echelle grating surface 260-5, and focuses into an outgoing waveguide 280. Outgoing waveguide 280 forms part of output line 235-5; in the embodiment shown, an optical fiber 290 couples with the outgoing waveguide in order to provide a convenient mode of transporting the outgoing light to a further combining device or optical output line. A V-groove 295 may be formed in substrate 201, and optical fiber 290 may be disposed within V-groove 295 for mechanical stability and accurate alignment with outgoing waveguide 280. Other embodiments may not include optical fiber or V-groove 295, but may instead simply continue outgoing waveguide 280 to another component. Techniques for creating waveguides 280, recesses 212, DBRs 216 and V-groove 295 are described in the incorporated applications noted above. Substrate 201 may be formed in parallel with other such substrates 201 as a part of a wafer, with some or all of echelle grating surface 260-5, waveguides 280, V-groove 295, recesses 212 and DBRs 216 formed in situ, and gain chips 214 added while in wafer form. After these steps, and/or further (optional) processing, the wafer may be singulated into individual substrates 201 for additional processing and integration into packages.

Another form of optical combining device is the Mach-Zehnder interferometer (MZI), which can advantageously be utilized for combining light from tunable lasers, especially tunable lasers with similar wavelengths. Use of MZIs as optical combining devices will now be described. Upon reading and understanding FIGS. 9 through 13 and the accompanying text herein, those skilled in the art will appreciate many potential ways to combine the teachings above involving echelle grating based combining devices, Y-branch couplers and similar equivalent devices, and/or MZI-based combining devices, to form widely tunable lasers.

Figure 9A:
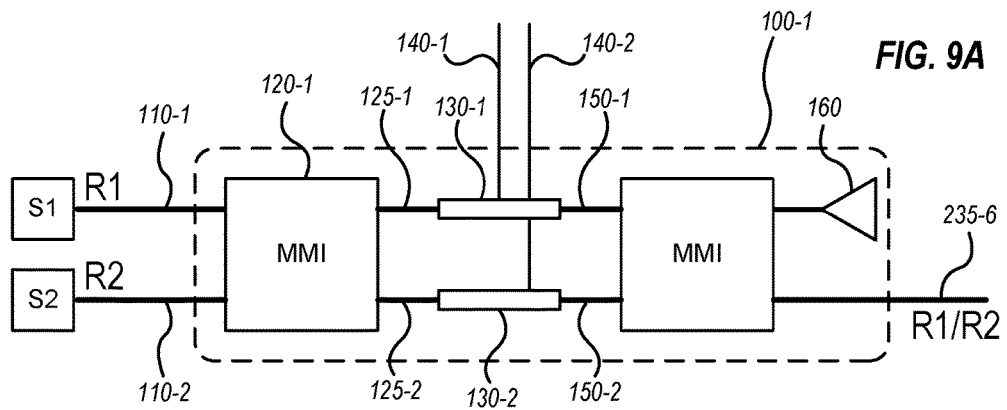
FIG. 9A schematically illustrates major elements of a Mach-Zehnder interferometer (MZI), according to an embodiment.

FIG. 9A schematically illustrates major elements of an MZI 100-1, according to an embodiment. MZI 100-1 takes two tunable inputs into optical input lines 110-1 and 110-2 and switches only one of the inputs into an output optical line 235-6. For illustrative purposes, these sources are labeled as S1 and S2 having respective wavelength ranges denoted as R1 and R2; sources S1, S2 are examples of any of input sources 210 discussed above, while ranges R1, R2 are examples of any of ranges 270 discussed above. Optical input lines 110-1 and 110-2 feed into a first 2×2 multimode interference coupler (MMI) 120-1, which mixes input light from optical input lines 110-1 and 110-2 into two MMI outputs 125-1 and 125-2 that connect with respective phase adjusters 130-1 and 130-2. Phase adjusters 130-1 and 130-2 provide adjustable phase delays for light in MMI outputs 125-1 and 125-2 that are controllable by respective signals 140-1 and 140-2. The nature of phase adjusters 130-1, 130-2 and their respective control signals 140-1, 140-2 can vary widely; for example they can adjust phase using thermal tuning, carrier injection and/or other electro-optical effects. Light originating in MMI outputs 125-1 and 125-2, appropriately phase delayed by phase adjusters 130-1 and 130-2, continues into optical lines 150-1, 150-2. In embodiments, a single phase adjuster 130-1 or 130-2 is used, instead of both.

Optical lines 150-1, 150-2 form inputs into a second 2×2 MMI 120-2. One skilled in the art appreciates that MMIs 120-1 and 120-2, with adjustable phase delays introduced by phase adjusters 130-1 and 130-2, form a Mach-Zehnder interferometer that causes constructive or destructive interference between optical lines 150-1, 150-2, which can be used to steer the input light from optical input lines 110-1, 110-2 into either output line of MMI 120-2. One such output line is shown terminated with an appropriate terminator 160. Terminator 160 is a non-reflecting optical component such as an absorber or radiator, such that any light reaching terminator 160 does not generate an unwanted reflection back into MMI 120-2 that could propagate further back into other parts of MZI 100-1. The other output line of MMI 120-2 forms an output optical line 235-6 from MZI 100-1.

Figure 9B:
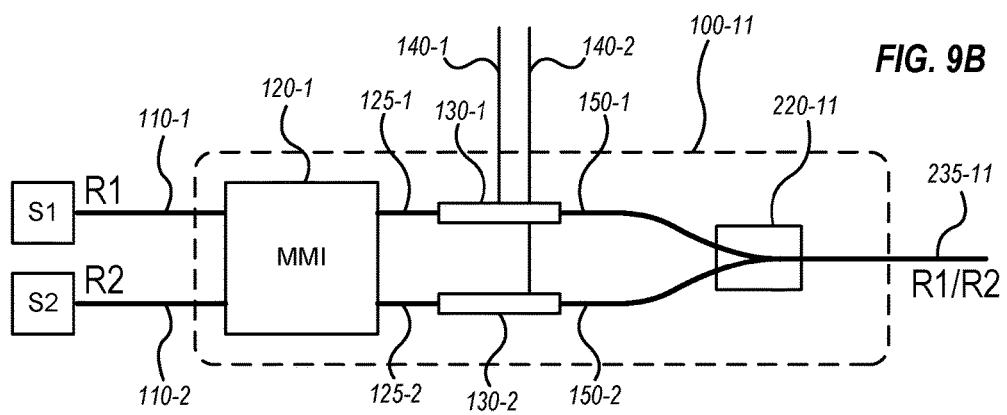
FIG. 9B schematically illustrates a combination of a multimode interference coupler and a Y-branch optical coupler to form an MZI, according to an embodiment FIG. 10 schematically illustrates major elements of another MZI, according to another embodiment.

In addition to the MMIs illustrated in FIG. 9A, other optical couplers can be utilized including other 2×2 couplers such as directional couplers, or the like. Also, for the output side of the MZI, other optical couplers including 2×1 couplers can be used such as 2×1 MMI, Y-branch optical couplers, 2×2 directional couplers, or the like. The optical couplers (e.g., the MMIs or other optical couplers) utilized in embodiments of the present invention can be tunable to cover the desired tuning range over which the input source wavelengths vary. Thermal tuning, electro-optic tuning, and other tuning mechanisms can be utilized in addition to multi-stage optical couplers to provide the desired tuning range. Moreover, in addition to Mach-Zehnder interferometers based solely on MMIs, other MZI configurations and other switches can be utilized such as ring resonator-based switches, Fabry-Perot resonator-based switches, and the like. An example is shown in FIG. 9B, which illustrates a combination of MMI 120-1 and Y-branch optical coupler 220-11 to form an MZI 100-11 that is similar to MZI 100-1, coupling output from one of sources S1 and S2 into optical output line 235-11. MZI 100-11 using Y-branch optical coupler 220-11 can work over a much broader wavelength bandwidth than strictly MMI-based MZIs, so that a tunable laser can be implemented using fewer switching devices.

In operation, light in output optical line 235-6 can be tuned to any wavelength available from sources S1 or S2. The specific wavelength can be chosen by first providing appropriate control signals 140-1, 140-2 to switch whichever one of S1 and S2 includes the specific wavelength in its range R1 or R2, to output optical line 235-6, and adjusting the selected one of S1 and S2 to the specific wavelength. The non-selected source S1 or S2 can be left on, turned off or blocked with an optical attenuator (typically a variable optical attenuator). It may be necessary to modify one or both of control signals 140-1, 140-2 when the wavelength of S1 and/or S2 is adjusted, or if the non-selected one of S1 or S2 is turned off. Thus, the adjustments made to the phase adjusters 130-1 and 130-2 are performed in conjunction with wavelength adjustments made to the source (e.g., source S1 or S2) in order to provide for efficient coupling of the desired wavelength input through the MZI to the output optical line 235-6.

In embodiments, values of control signals 140-1, 140-2 are predetermined in a factory calibration step and are provided to a user and/or preloaded into to software or firmware that controls the system. Similarly, the wavelength tuning of each source S1, S2 is known or predetermined in a factory calibration step, such that each source can be driven to a desired power and/or wavelength value in use. In embodiments, sources S1, S2 may include monitoring photodiodes such that power can be monitored. As discussed above, adjustments to the wavelength of the source and the phase of the phase adjusters are performed in conjunction with each other to improve system performance.

Figure 10:
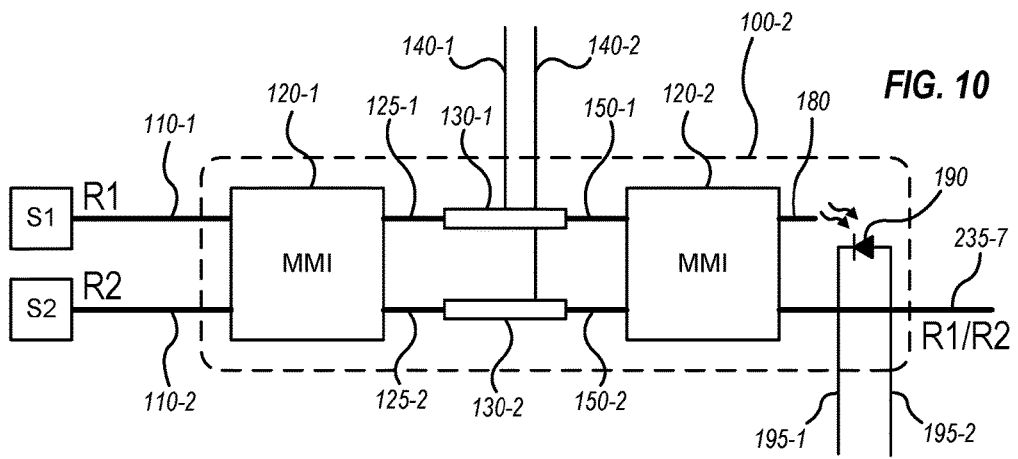

FIG. 10 schematically illustrates major elements of a Mach-Zehnder interferometer (MZI) 100-2, according to an embodiment. Most of the components and principles of operation of MZI 100-2 are identical to those of MZI 100-1, FIG. 9A. In MZI 100-2, terminator 160 is replaced by an optical output line 180, which may be a waveguide that couples output light from MZI 100-2 to a photodiode 190. Photodiode 190 is biased by, and generates a monitor current through, lines 195-1, 195-2. The monitor current is proportional to light received by photodiode 190 from output line 180. The monitor current through lines 195-1, 195-2 can be utilized as feedback on the performance of MZI 100-2; for example, efficient coupling of the selected one of the sources S1, S2 into output line 235-7 may be achieved by adjusting control signals 140-1, 140-2 until the monitor current through photodiode 190 is minimized, thus minimizing light exiting output line 180.

Figure 11:
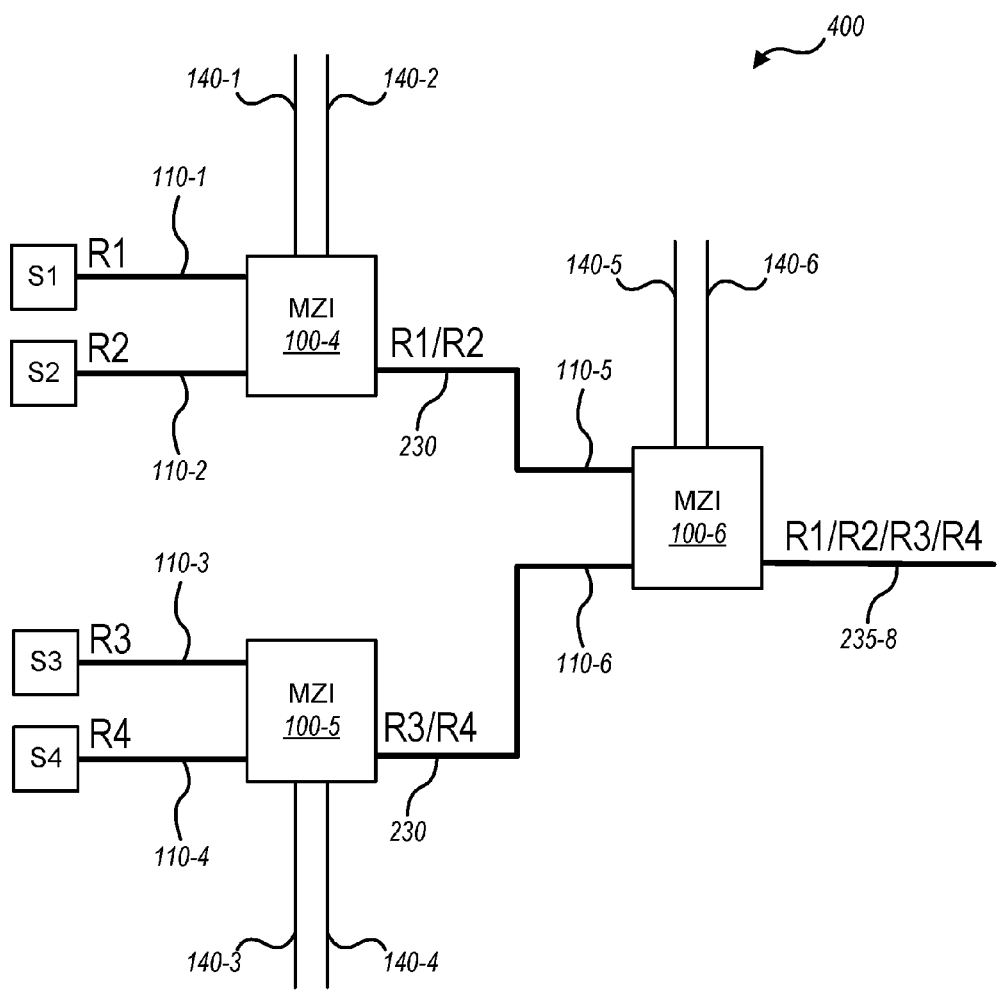
FIG. 11 schematically illustrates a widely tunable laser source, according to an embodiment.

FIG. 11 schematically illustrates a widely tunable laser source 400, according to an embodiment. As illustrated in FIG. 11, a plurality of multiple tunable laser sources S1 through S4 are provided in parallel and then switched in a cascade arrangement using MZI-based switches like those illustrated in FIGS. 9 and 10, to form the widely tunable laser source 400. For illustrative purposes, MZIs 100 in FIG. 11 are shown as having two input lines 110 but only one output into an intermediate path 230, it being understood that the other output of the corresponding MMI is terminated, as shown in FIGS. 9 and 10. Laser source 400 uses three instances of MZIs in a cascaded arrangement to allow selection of any one of four input laser sources S1, S2, S3 and S4 with corresponding tunable wavelength ranges R1, R2, R3 and R4 (e.g., R1=1480-1510 nm, R2=1510-1540 nm, R3=1540-1570 nm, and R4=1570-1600 nm. In a first stage of laser source 400, MZI 100-4 utilizes control signals 140-1, 140-2 to switch light from one of S1 and S2 onto one intermediate path 230, while MZI 100-5 utilizes control signals 140-3, 140-4 to switch laser light from one of S3 and S4 onto another intermediate path 230. In a second stage of laser source 400, MZI 100-6 utilizes control signals 140-5, 140-6 to switch light from one of the intermediate paths 230 onto output line 235-8. Thus, tunable laser source can switch among any of laser sources S1, S2, S3 and S4, each of which can be tuned across its own range, such that output of laser source 400 is tunable across the entire range R1 through R4 (e.g., 1480-1600 nm). Of course the present invention is not limited to these particular wavelength ranges and other wavelength ranges for both the individual sources and the overall or aggregate range are included within the scope of the present invention.

It will be clear to one skilled in the art that in embodiments, further stages of MZIs can be cascaded to select from more laser sources than are shown in FIG. 11, to create a laser source that is tunable across all such sources. It should also be clear that the MZIs used can be either (or both) types of MZI 100-1 or 100-2, or other types with similar functionality in the sense of providing a switching function. As an example, 16 MZIs could be used in the first level of the cascaded, followed by 8 MZIs, 4 MZIs, 2 MZI, and 1 MZI, providing a tuning range up to 16 times the tuning range of the individual input sources. In this example, if each input source has an input range of 40 nm, and one end the input range of each source extends at least to another end of the input range of the next, the whole system will be tunable across a range of 1280 nm.

Figure 12:
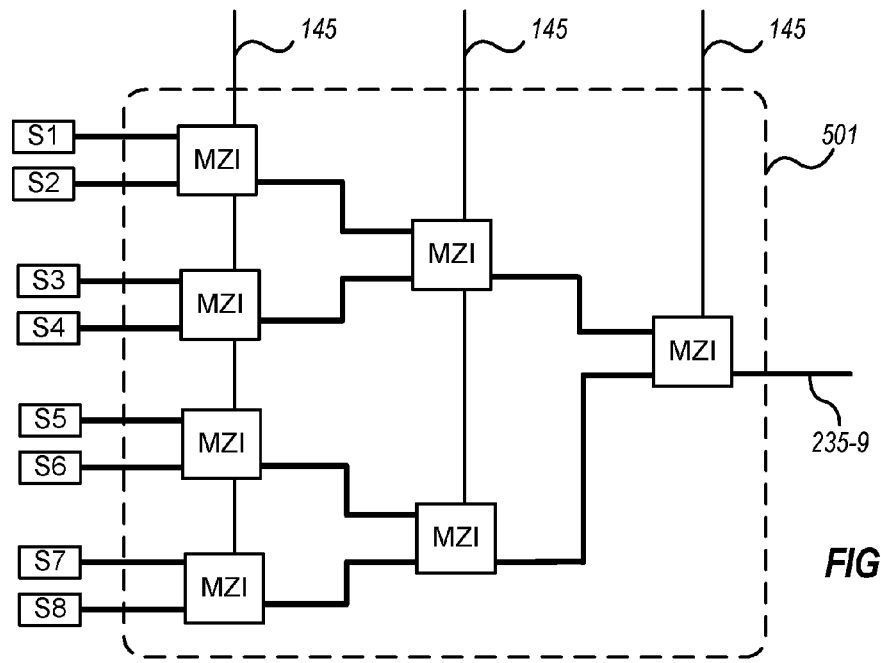
FIG. 12 schematically illustrates a cascading arrangement of MZIs provided in a single substrate, according to an embodiment.

Tunable laser sources as disclosed herein can be advantageously integrated with a substrate, with or without the laser sources on board, and with or without circuitry to facilitate tuning the laser sources and/or provide the control signals to effect phase adjustments in the MZI switches. For example, in one embodiment a cascading arrangement of MZIs is provided in a single substrate 501, as shown in FIG. 12. The level of integration shown in FIG. 4 is leveraged by (but is not limited to) optical integration of waveguides and phase adjustment devices to form the MZIs onto a substrate fabricated with silicon processing technology (e.g., a CMOS chip). Individual sources S1-S8 are optically coupled into first stage MZIs, whose outputs are coupled into successively higher stage MZIs until a single output line 235-9 exits from substrate 501. For expedient illustration, in FIG. 4, control signals to the MZIs are shown as grouped into control lines 145; it is understood that each control line 145 may represent one or multiple control signals 140, as shown in FIGS. 9-11. Tuning control to adjust wavelength of each input source S1-S8 is not shown.

Figure 13:
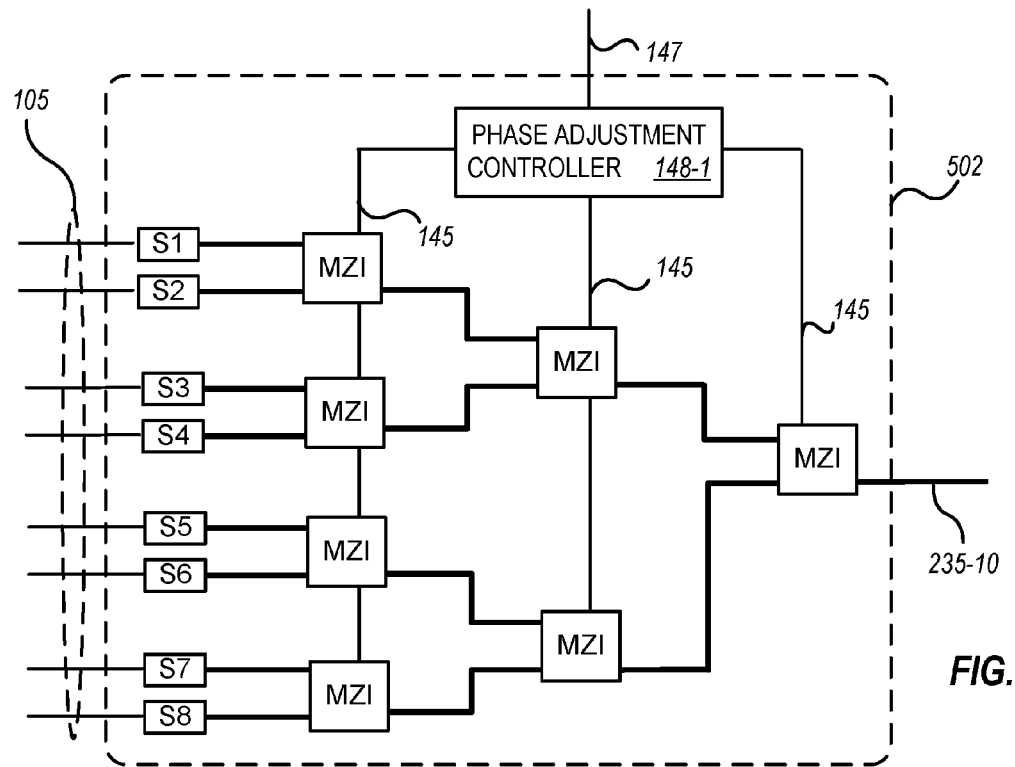
FIG. 13 schematically illustrates input sources and control of phase adjustments to MZIs integrated into a single substrate, according to an embodiment.

A higher level of integration is illustrated in FIG. 13, which schematically shows input sources S1-S8 and control of phase adjustments to MZIs integrated into a single substrate 502. This level of integration is available for example through processes that monolithically integrate III-V active (e.g., gain) layers to form sources S1-S8, as well as the waveguides and phase adjustment devices. As shown in FIG. 13, substrate 502 includes a phase adjustment controller 148-1 that generates signals on control lines 145. Phase adjustment controller 148-1 may be fabricated in silicon technology (e.g., CMOS), and may be pre-loaded or configured at factory calibration with values that are effective for switching the appropriate MZIs, given input that is presented to the MZIs. That is, as noted above, since phase adjustment values that are sufficient to switch the required source to each MZI output are dependent on the input wavelengths, each MZI will require a different set of phase adjustment control values particular to the sources presented and the output desired. Sources S1-S8 are shown as tuned by off-chip control signals 105, but control signals 105 could also be generated on-chip, in a manner analogous to phase adjustment controller 148-1. Phase adjustment controller 148-1 may for example receive input 147 indicating a desired wavelength desired at an output 235-10, and provide appropriate tuning for the MZIs to switch the appropriate one of sources S1-S8 (or further sources) into output 235-10.

Of course, the concepts described herein can also be implemented with other levels of integration including use of discrete components that are not necessarily packaged together. In certain embodiments, input sources that are switched according to the principles herein are direct bandgap semiconductor chips (e.g., III-V materials such as GaAs, InGaAs, InAlGaAs, GaN, InP and others) that can be mounted to one or more silicon substrates for integration with other components formed therein, such as waveguides and tuning elements, that form the MZIs, yielding a widely tunable laser source. In other embodiments, one or more external laser sources of other types are optically coupled (e.g., using waveguides and/or fiber optic connections) with an integrated, cascading MZI arrangement to form a widely tunable source. In still other embodiments, some of the input sources are direct bandgap semiconductor chips such as discussed above, while others of the input sources are optically connected, external laser sources.

Figure 14:
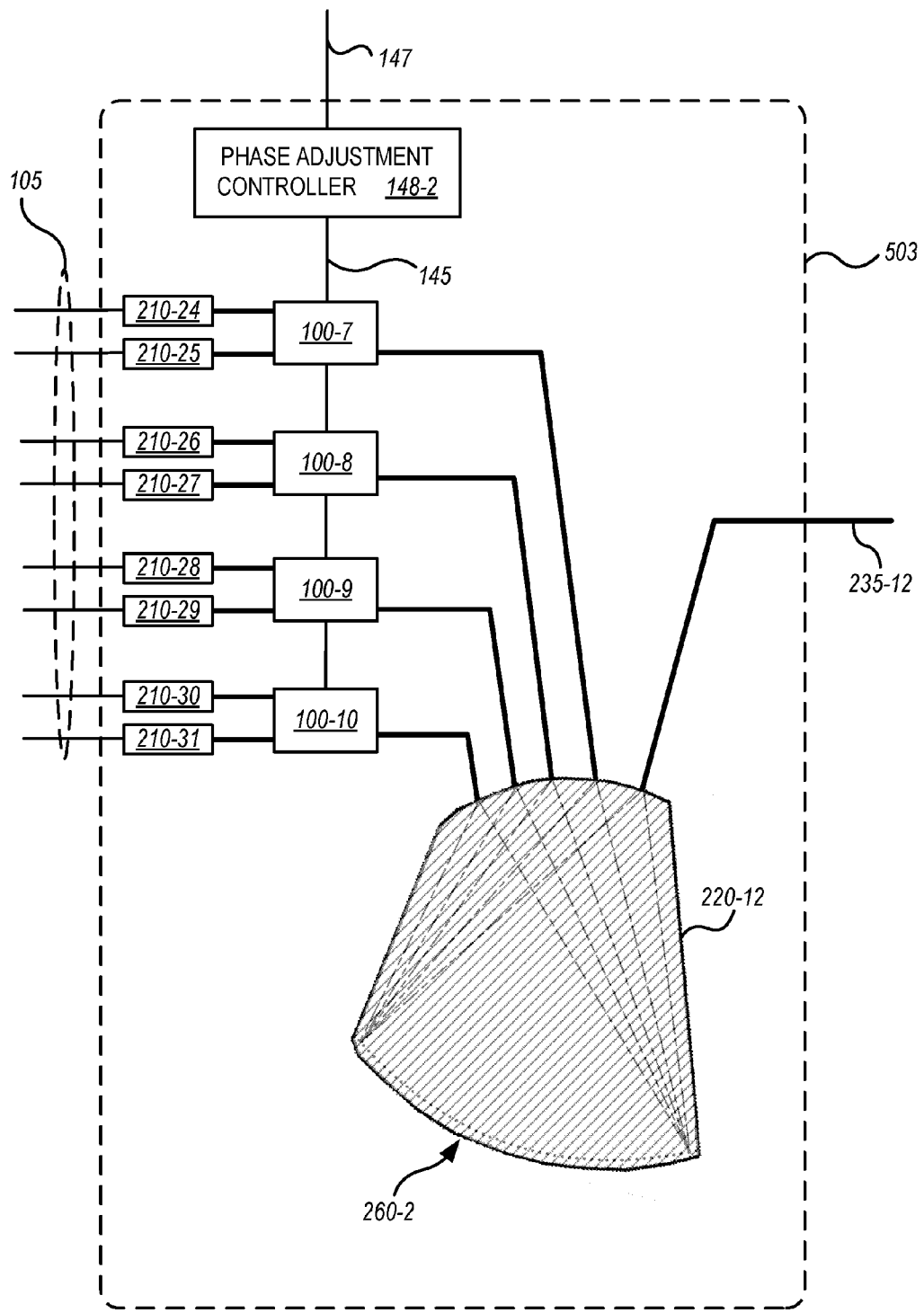
FIG. 14 schematically illustrates a substrate that integrates input sources, MZIs that combine light from pairs of the input sources into intermediate paths, and an echelle grating that combines light from the intermediate paths into an output line, according to an embodiment.

FIG. 14 schematically illustrates a substrate 503 that integrates input sources 210-24 through 210-31, MZIs 100-7 through 100-10 that combine light from pairs of the input sources into intermediate paths 230, and an echelle grating 220-12 that combines light from the intermediate paths 230 into an output line 235-12. Similar to substrate 502 shown in FIG. 13, substrate 503 has a phase adjustment controller 148-2 that takes external input 147 and translates that input into one or more control lines 145 that are applied to MZIs 100-7 through 100-10.

Input sources 210-24 through 210-31 have successively increasing ranges such that the inputs into each MZI 100-7 through 100-10 are nearby in wavelength to one another, such that each MZI 100-7 through 100-10 need be tunable only across a small total range (e.g., the combined range of each pair of input sources). For example, if the input range of each input source 210-24 through 210-31 is about 40 nm wide, the total tunable range of each MZI 100-7 through 100-10 need be only about 80 nm. It is less challenging to build an MZI to work across limited wavelength ranges than wide wavelength ranges. At the same time, given the same ranges noted above, the nominal difference in the center wavelength of adjacent pairs will be about 80 nm. Arranging adjacent inputs having a nominal wavelength separation 80 nm to an echelle grating will be less challenging than if the nominal wavelength separations were 40 nm. Thus the arrangement shown in FIG. 14 takes advantage of the strengths of each of the two types of optical combining devices, to yield an overall tunable range of about 8×40 nm=320 nm.

Figure 15:
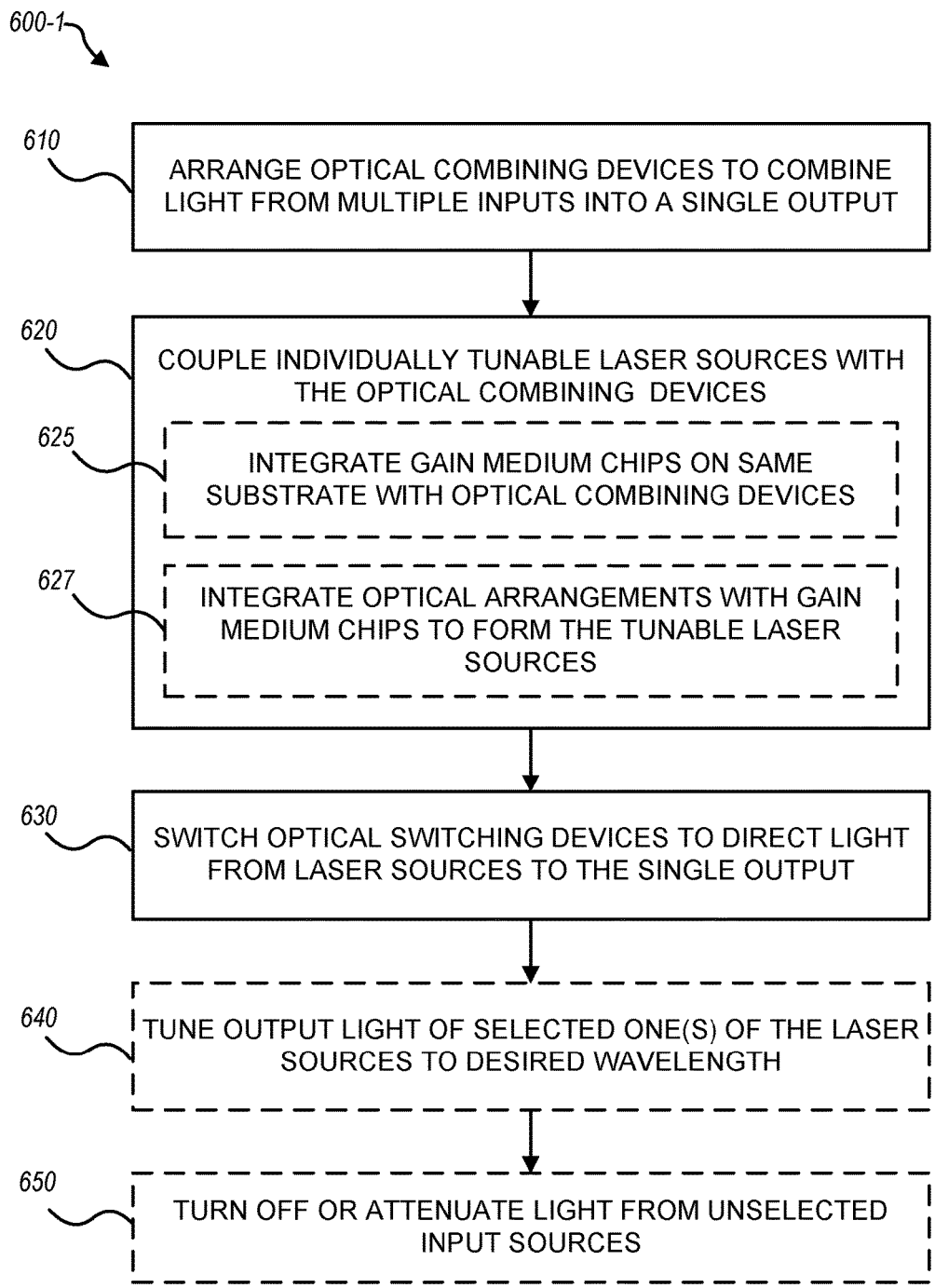
FIG. 15 is a flowchart of a method for providing a widely tunable laser system, according to an embodiment.

FIG. 15 is a flowchart of a method 600-1 for providing a widely tunable laser system. Method 600-1 can be implemented using laser sources 210 as described herein, along with optical combining devices 220 (FIG. 2) which may be echelle gratings (FIGS. 3A, 3B, 4, 6, 8, 14), MZIs (FIGS. 9-14), Y-branch combiners (FIG. 6), ring oscillators or other devices for combining two or more optical sources into a common output. Method 600-1 advantageously integrates some or all of laser sources 210, optical combining devices 220, waveguides, V-grooves, photodiodes, phase adjustment controllers and/or other related components, onto a single substrate, such as but not limited to substrates 201, 501, 502, 503 discussed above (FIGS. 8, 12, 13, 14). It will be appreciated by one skilled in the art upon reading and understanding the following description of method 600-1, that the steps thereof may be performed in any order, that certain steps may be omitted or may be performed passively by the structures disclosed, that steps may be repeated, and that further steps may be added.

Method 600-1 begins with a step 610 of arranging optical combining devices to form an arrangement that combines light from multiple inputs into a single output for the widely tunable laser system. For example, step 610 may arrange one or more echelle gratings, MZIs, ring oscillators, Y-branch combiners or similar devices so as to combine light from inputs to the devices into the single output. In embodiments, some or all of the optical combining devices are switching type devices that direct light from certain input sources into the single output while excluding light from other input sources from the single output, for example, using MZIs or ring oscillators. In other embodiments, light from all input sources may be combined into the single output (e.g., using echelle gratings or Y-branch combiners); optical combining devices that operate by switching and combining type actions can also be used together in an arrangement. The optical combiners can form a cascading arrangement, for example as shown in FIGS. 2, 6 and 11-14. The number of switching stages shown in certain ones of FIGS. 2, 6 and 11-14 are by way of illustration only; any number of stages can be implemented using the teachings herein. In embodiments, the optical switching devices may be integrated by creating and/or coupling them within a single silicon substrate. Techniques for physically integrating echelle gratings, waveguides, MMIs and MZIs with silicon substrates can be found in the discussion of FIG. 8 above, and in the incorporated applications.

Step 620 of method 600-1 couples individually tunable laser sources with respective ones of the optical combining devices arranged in step 610. In certain embodiments, direct bandgap semiconductor gain medium chips form at least parts of the individually tunable laser sources; an optional step 625 integrates such chips with a silicon substrate in which the optical switching devices are coupled. Techniques for integrating direct bandgap semiconductor chips with silicon substrates can be found in U.S. Pat. Nos. 8,615,025, 8,859,394 and 9,316,785. A further optional step 627 integrates each gain medium chip with a respective optical arrangement to form a tunable laser source based on the gain medium chip. An example of step 627 is providing DBRs 216 (FIG. 8), or equivalently, one or more cleaved and/or mirrored end facets, to provide an optical cavity about each gain chip. In other embodiments, step 620 couples one or more laser sources of other types with the optical switching devices, for example using waveguides, fiber optic connections and the like.

Step 630 switches one or more of the optical switching devices so as to direct light from at least a selected one of the laser sources into the single output of the cascade arrangement of the laser system. Those optical combining devices based on echelle gratings or Y-branch combiners perform step 630 passively, that is, any light input to such combiners propagates to their outputs without need for active tuning or adjustment. Other examples of step 630 include providing control signals 140 or 145 to individual MZIs acting as the combining devices, as shown in FIGS. 9, 10, 11 and 12, or by providing input 147 to phase adjustment controller 148-1, FIG. 13, which generates appropriate control signals for MZIs; similar steps would be undertaken to tune a ring oscillator such that light from only one of the inputs constructively interferes and is passed out of the associated output.

When step 630 is complete, light from at least one of the laser sources will appear at the single output of the widely tunable laser system. For some purposes, selection of a single laser source will provide sufficient wavelength specificity (e.g., the selected source will be within its individual range, as discussed above in connection with FIGS. 5 and 7). For other purposes, an optional step 640 further tunes the selected one of the laser sources to a more specific wavelength. An example of step 640 is tuning the selected laser source 210, or tuning any one of S1, S2, . . . S8 (or any higher numbered source, when more than eight sources are present) in any of FIGS. 9 through 13, for example by using control signals 105, FIG. 13. Further information about tuning wavelength of laser sources generated as discussed herein may be found in the incorporated applications (especially in U.S. Pat. No. 8,615,025 and U.S. Published Patent Application No. 2015-00311672A1).

In certain embodiments, as discussed above, light from any input sources that are turned on may appear at the single output of the laser system. Therefore, an optional step 650 turns off or attenuates light from unselected input sources so that it does not appear at the output. Step 650 may be omitted when it is desired that light of more than one wavelength appear in the single output.

Figure 16:
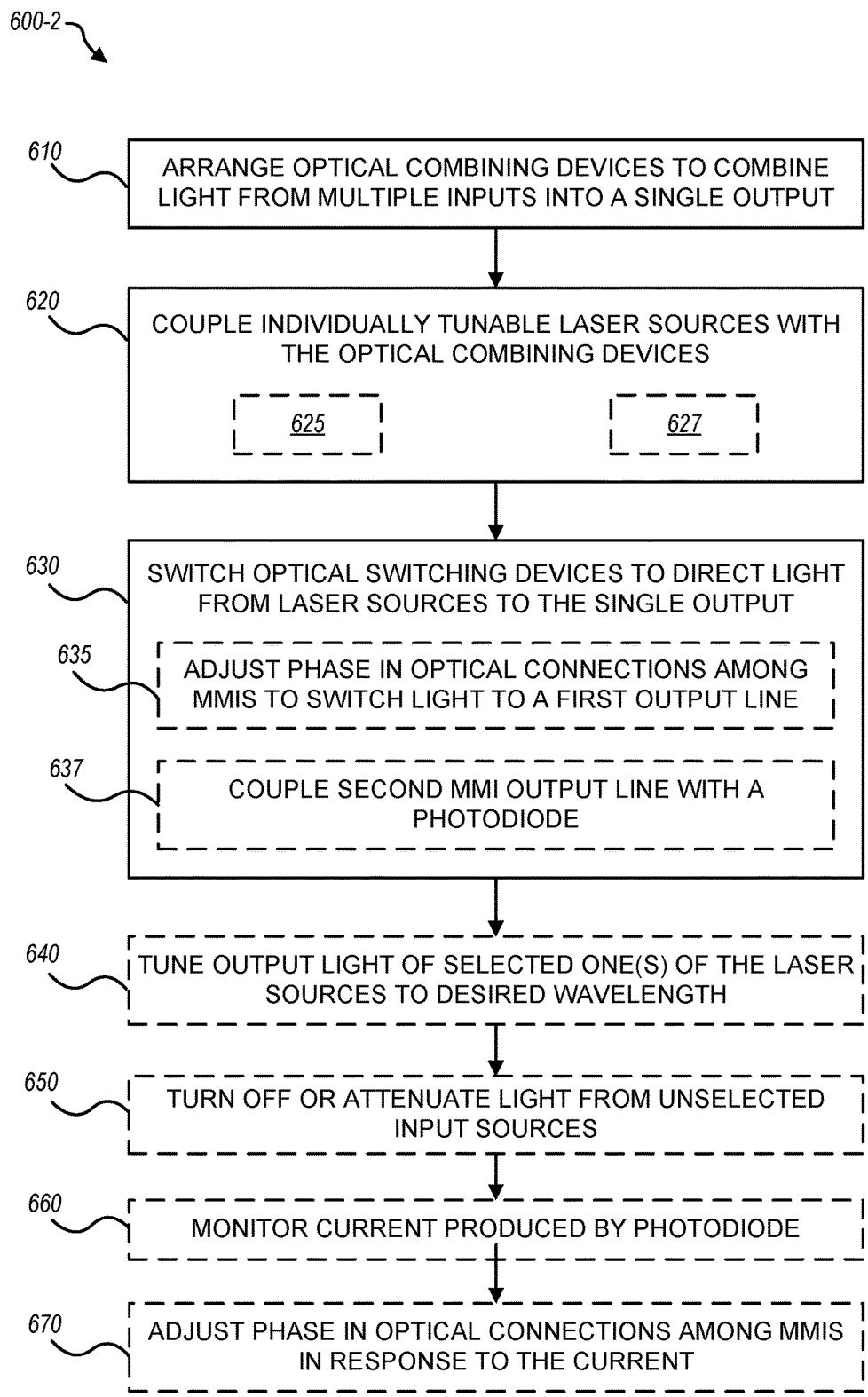
FIG. 16 is a flowchart of a method for providing a widely tunable laser system, according to an embodiment.

FIG. 16 is a flowchart of a method 600-2 for providing a widely tunable laser system. Method 600-2 includes many of the steps of method 600-1, FIG. 15, and includes further optional steps and substeps that are specific to optical arrangements that include one or more MZIs, as discussed above. Method 600-2 can be implemented using laser sources 210 as described herein, along with optical combining devices 220 (FIG. 2) which may be echelle gratings (FIGS. 3A, 3B, 4, 6, 8, 14), MZIs (FIGS. 9-14), Y-branch combiners (FIG. 6), ring oscillators or other devices for combining two or more optical sources into a common output. Method 600-2 advantageously integrates some or all of laser sources 210, optical combining devices 220, waveguides, V-grooves, photodiodes, phase adjustment controllers and/or other related components, onto a single substrate, such as but not limited to substrates 201, 501, 502, 503 discussed above (FIGS. 8, 12, 13, 14).

Method 600-2 begins with step 610 of forming an arrangement of optical combining devices to combine light from multiple inputs into a single output for the widely tunable laser system. Step 610 is identical to step 610 of method 600-1, discussed above.

Step 620 of method 600-2 couples individually tunable laser sources with respective ones of the optical switching devices arranged in step 610. Step 620 is identical to step 610 of method 600-1, discussed above, and similarly, may include optional steps 625 and 627, also discussed above, the text of which is not reiterated in FIG. 16 for clarity of illustration.

Step 630 switches one or more of the optical switching devices so as to direct light from at least a selected one of the laser sources into the single output of the cascade arrangement of the laser system. As discussed above, those parts of a system that use echelle gratings or Y-branch combiners perform step 630 passively, that is, any light input to such combiners propagates to their outputs without need for tuning or adjustment. Other examples of step 630 include providing control signals 140 or 145 to individual MZIs acting as the combining devices, as shown in FIGS. 9, 10, 11 and 12, or by providing input 147 to phase adjustment controller 148-1, FIG. 13, which generates appropriate control signals for MZIs; similar steps would be undertaken to tune a ring oscillator such that light from only one of the inputs constructively interferes and is passed out of the associated output. In method 600-2, step 630 can include an optional substep 635 wherein the mechanism for the switching is to adjust phase in optical connections between a first MMI to a second MIMI that form an MZI, to switch input light into a first output line of the second MMI, as shown in FIGS. 1 and 2. Also optionally, step 630 can include a substep 637 of coupling a second output line of the second MMI to a photodiode, as shown in FIG. 10.

An optional step 640 further tunes the selected one of the laser sources to a more specific wavelength. Step 640 is identical to step 640 of method 600-1, discussed above. An optional step 650 turns off or attenuates light from unselected input sources so that it does not appear at the output. Step 650 may be omitted when it is desired that light of more than one wavelength appear in the single output. Step 650 is identical to step 650 of method 600-1, discussed above.

Further optional steps in method 600-2 are a step 660 that monitors a current produced by the photodiode that was coupled to a second MMI output line in step 637, and a step 670 that adjust phase in optical connections among MMIs in response to the current. Examples of steps 650 and 660 are adjusting control signals 140-1 and/or 140-2 until the monitor current through photodiode 190 is minimized, as discussed in connection with FIG. 10, thus minimizing light exiting output line 180 and maximizing efficient propagation of light from the selected laser source into output line 170.

It should thus be clear that a variety of integration and/or control strategies are contemplated as within the scope of the present application, up to and including a monolithically integrated, tunable laser source on a single chip or substrate that can take power and wavelength selection criteria as inputs, and can select and tune one of an available set of on-chip sources to provide the selected wavelength as output.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a," "an," and "the" include plural referents unless the context clearly dictates otherwise. Thus, for example, reference to "a process" includes a plurality of such processes and reference to "the electrode" includes reference to one or more electrodes and equivalents thereof known to those skilled in the art, and so forth. Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

We claim:

1. A widely tunable laser system comprising:
   a substrate;
   a first laser, wherein:
      the first laser is integrated with the substrate;
      the first laser comprises a gain medium that includes a first material; and
      the first laser emits a first light into a first laser output at a wavelength that is tunable within a first wavelength range, wherein the first wavelength range is determined at least in part by the first material;
   a second laser, wherein:
      the second laser is integrated with the substrate;
      the second laser comprises a gain medium that includes a second material; and
      the second laser emits a second light into a second laser output at a wavelength that is tunable within a second wavelength range that is different from the first wavelength range, wherein the second wavelength range is determined at least in part by the second material;
   a first Mach-Zehnder interferometer into which the first and second laser outputs are coupled, wherein the first Mach-Zehnder interferometer is operable to selectively direct either the first light or the second light into a first Mach-Zehnder interferometer output;
   a third laser, wherein:
      the third laser is integrated with the substrate;
      the third laser comprises a gain medium that includes a third material; and
      the third laser emits a third light into a third laser output at a wavelength that is tunable within a third wavelength range that is different from the first and second wavelength ranges, wherein the third wavelength range is determined at least in part by the third material;
   a fourth laser, wherein:
      the fourth laser is integrated with the substrate;
      the fourth laser comprises a gain medium that includes a fourth material; and
      the fourth laser emits a fourth light into a fourth laser output at a wavelength that is tunable within a fourth wavelength range that is different from the first, second and third wavelength ranges, wherein the fourth wavelength range is determined at least in part by the fourth material;
   a second Mach-Zehnder interferometer into which the third and fourth laser outputs are coupled, wherein the second Mach-Zehnder interferometer is operable to selectively direct either the third light or the fourth light into a second Mach-Zehnder interferometer output; and
   an echelle grating configured to direct light from the first and second Mach-Zehnder interferometer outputs into an output of the widely tunable laser system.

2. The widely tunable laser system of claim 1, wherein the substrate comprises silicon.

3. The widely tunable laser system of claim 1, further comprising a waveguide into which the light from at least one of the first laser and the second laser are coupled.

4. The widely tunable laser system of claim 3, wherein the waveguide comprises crystalline silicon.

5. The widely tunable laser system of claim 1 wherein each of the first and second wavelength ranges are at least 40 nm wide, and the first wavelength range and the second wavelength range are contiguous, and the first Mach-Zehnder interferometer has a total tunable range of at least 80 nm.

6. The widely tunable laser system of claim 1 wherein the first, second, third and fourth wavelength ranges are each at least 40 nm wide, and the first, second, third and fourth wavelength ranges are contiguous to form a tuning bandwidth of at least 160 nm for the widely tunable laser system.

7. The widely tunable laser system of claim 6 wherein a nominal wavelength separation of the first Mach-Zehnder interferometer output and the second Mach-Zehnder interferometer output is at least 80 nm.

8. The widely tunable laser system of claim 1 further comprising:
   a fifth laser, wherein:
      the fifth laser is integrated with the substrate,
      the fifth laser comprises a gain medium that includes a fifth material, and
   each additional laser emits a fifth light into a fifth laser output at a wavelength that is tunable within a fifth wavelength range that is different from the first, second, third and fourth wavelength ranges, and is determined at least in part by the fifth material;
a sixth laser, wherein:
the sixth laser is integrated with the substrate,
the sixth laser comprises a gain medium that includes a sixth material, and
each additional laser emits a sixth light into a sixth laser output at a wavelength that is tunable within a wavelength range that is different from the first, second, third, fourth and fifth wavelength ranges, and is determined at least in part by the sixth material;
and
a third Mach-Zehnder interferometer into which the fifth and sixth laser outputs are coupled, wherein the third Mach-Zehnder interferometer is operable to selectively direct either the fifth light or the sixth light into a third Mach-Zehnder interferometer output; and
the echelle grating is configured to direct light from any of the first Mach-Zehnder interferometer output, the second Mach-Zehnder interferometer output and the third Mach-Zehnder interferometer output into the output of the widely tunable laser system.

9. A method for providing a widely tunable laser system, comprising:
integrating at least four independently fabricated gain medium chips with a substrate;
integrating each independently fabricated gain medium chip with a respective optical arrangement to form at least four corresponding individually tunable lasers, each of the individually tunable lasers being tunable over an individual wavelength range;
coupling outputs of a first and a second one of the individually tunable lasers into inputs of a first Mach-Zehnder interferometer that is operable to direct light from either the first or the second one of the individually tunable lasers into a first Mach-Zehnder interferometer output;
coupling outputs of a third and a fourth one of the individually tunable lasers into inputs of a second Mach-Zehnder interferometer that is operable to direct light from either the third or the fourth one of the individually tunable lasers into a second Mach-Zehnder interferometer output;
coupling the first and second Mach-Zehnder interferometer outputs, with an echelle grating, to provide an output of the widely tunable laser system.

10. The method of claim 9, wherein the individual wavelength ranges are contiguous within an overall wavelength range, further comprising tuning an output light of one of the at least four individually tunable lasers that is directed into the output of the widely tunable laser system, to a desired wavelength within the overall wavelength range.

11. The method of claim 9, further comprising operating the first and second Mach-Zehnder interferometers so as to direct light from at least one of the individually tunable lasers into a corresponding one of the first and second Mach-Zehnder interferometer outputs such that the echelle grating directs the light into the output of the widely tunable laser system.

12. The method of claim 9, further comprising at least one of attenuating or turning off one of the individually tunable lasers when light from the one of the individually tunable lasers does not appear at the output of the widely tunable laser system.

13. The method of claim 8, wherein coupling the outputs of the first and second Mach-Zehnder interferometers with the echelle grating comprises arranging the first and second Mach-Zehnder interferometers and the echelle grating in a cascading arrangement.

14. The method of claim 9, wherein integrating the at least four independently fabricated gain medium chips with the substrate comprises placing each of the at least four independently fabricated gain medium chips into respective recesses of a substrate comprising silicon, the respective recesses for each of the at least four independently fabricated gain medium chips being discontiguous with one another.

15. The method of claim 9, wherein integrating each independently fabricated gain medium chip with a respective optical arrangement comprises optically coupling each of the independently fabricated gain medium chips with a waveguide.

16. The method of claim 9, wherein coupling outputs of a first and a second one of the individually tunable lasers into inputs of the first Mach-Zehnder interferometer comprises fabricating the first Mach-Zehnder interferometer on the substrate.

17. The method of claim 9, wherein integrating each independently fabricated gain medium chip with a respective optical arrangement comprises forming a respective optical cavity for each independently fabricated gain medium chip.

18. The method of claim 11, wherein operating the first and second Mach-Zehnder interferometers comprises propagating light from one of the individually tunable lasers through the corresponding one of the first and second Mach-Zehnder interferometer outputs, while preventing light from another of the individually tunable lasers from propagating through the corresponding one of the first and second Mach-Zehnder interferometer outputs.

* * * * *